(12) United States Patent
Chi et al.

(10) Patent No.: US 10,424,734 B2
(45) Date of Patent: Sep. 24, 2019

(54) METHOD FOR MAKING ORGANIC LIGHT EMITTING DIODE

(71) Applicants: Tsinghua University, Beijing (CN); HON HAI PRECISION INDUSTRY CO., LTD., New Taipei (TW)

(72) Inventors: Chin-Wei Chi, New Taipei (TW); Wen-Chieh Liao, New Taipei (TW); Shou-Shan Fan, Beijing (CN)

(73) Assignees: Tsinghua University, Beijing (CN); HON HAI PRECISION INDUSTRY CO., LTD., New Taipei (TW)

( * ) Notice: Subject to any disclaimer, the term of this patent is extended or adjusted under 35 U.S.C. 154(b) by 0 days.

(21) Appl. No.: 16/121,792

(22) Filed: Sep. 5, 2018

(65) Prior Publication Data
US 2019/0115534 A1 Apr. 18, 2019

(30) Foreign Application Priority Data
Sep. 22, 2017 (CN) .......................... 2017 1 0865957

(51) Int. Cl.
| H01L 51/00 | (2006.01) |
| H01L 51/56 | (2006.01) |
| H01L 51/50 | (2006.01) |

(52) U.S. Cl.
CPC ........ *H01L 51/001* (2013.01); *H01L 51/5012* (2013.01); *H01L 51/5056* (2013.01); *H01L 51/5072* (2013.01); *H01L 51/5088* (2013.01); *H01L 51/5092* (2013.01); *H01L 51/56* (2013.01)

(58) Field of Classification Search
None
See application file for complete search history.

(56) References Cited

U.S. PATENT DOCUMENTS

| 9,425,400 B2* | 8/2016 | Shen ...................... B05B 5/001 |
| 2004/0062856 A1 | 4/2004 | Marcus et al. |
| 2012/0279449 A1* | 11/2012 | Chu ......................... C23C 14/48 |
| | | 118/723 R |
| 2015/0307984 A1 | 10/2015 | Riber |
| 2016/0244872 A1 | 8/2016 | Park et al. |

FOREIGN PATENT DOCUMENTS

| CN | 105002463 | 10/2015 |
| TW | 201341555 | 10/2013 |
| TW | 201346052 | 11/2013 |

* cited by examiner

*Primary Examiner* — Bradley Smith
(74) *Attorney, Agent, or Firm* — ScienBiziP, P.C.

(57) ABSTRACT

A method for making an organic light emitting diode includes providing an apparatus including an evaporation device, a vapor deposition device, a connecting tube, and a vacuum pump. A substrate is placed on the support and a first electrode is formed on a surface of the substrate away from the support, wherein the first electrode comprises an electrode surface away from the substrate. The vapor deposition chamber is evacuated by the vacuum pump. The organic light emitting source material is heated to form a gaseous organic light emitting source material, and the gaseous organic light emitting source material is sprayed to the electrode surface, to form an organic light emitting layer. A second electrode is formed on a surface of the organic light emitting layer away from the first electrode.

13 Claims, 12 Drawing Sheets

METHOD FOR MAKING ORGANIC LIGHT EMITTING DIODE

CROSS-REFERENCE TO RELATED APPLICATIONS

This application claims all benefits accruing under 35 U.S.C. § 119 from China Patent Application No. 201710865957.6, filed on Sep. 22, 2017, in the China Intellectual Property Office. This application is related to commonly-assigned application entitled, "APPARATUS FOR MAKING ORGANIC LIGHT EMITTING DIODE", concurrently filed. Disclosures of the above-identified applications are incorporated herein by reference.

FIELD

The present application relates to organic light emitting diodes and methods for making the same.

BACKGROUND

The organic light emitting diode (OLED) is a light emitting diode including a light emitting layer composed of an organic compound. The OLED has a light weight, thin thickness, multi-color, and low manufacturing cost. Thus, the OLED has been widely used in various fields.

The OLED is usually prepared by vapor deposition method. However, during forming the organic light emitting layer, the gaseous organic light emitting source material diffuses in all directions and partial organic light emitting source material is deposited on the inner wall of the vapor deposition chamber, causing the organic light emitting source material waste.

What is needed, therefore, is to provide an organic light emitting diode and a method for making the same that can overcome the above-described shortcomings.

BRIEF DESCRIPTION OF THE DRAWINGS

Implementations of the present technology will now be described, by way of example only, with reference to the attached figures, wherein.

DETAILED DESCRIPTION

Figure 1:
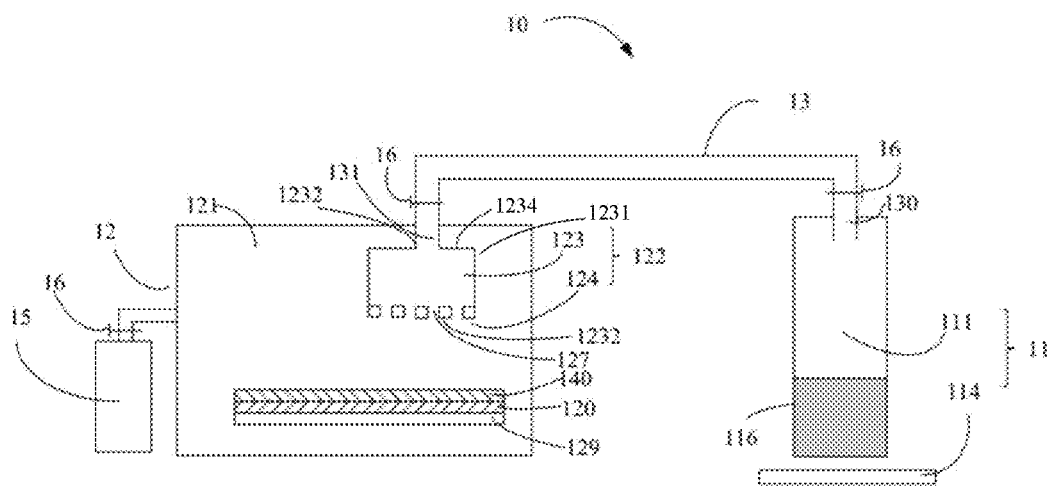
FIG. 1 is a schematic view of a first embodiment of an apparatus for making an organic light emitting diode.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. The drawings are not necessarily to scale, and the proportions of certain parts may be exaggerated to illustrate details and features better. The description is not to be considered as limiting the scope of the embodiments described herein.

Several definitions that apply throughout this disclosure will now be presented.

The term "substantially" is defined to be essentially conforming to the particular dimension, shape or other word that substantially modifies, such that the component need not be exact. For example, substantially cylindrical means that the object resembles a cylinder, but can have one or more deviations from a true cylinder. The term "comprising" means "including, but not necessarily limited to"; it specifically indicates open-ended inclusion or membership in a so-described combination, group, series and the like.

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

Figure 2:
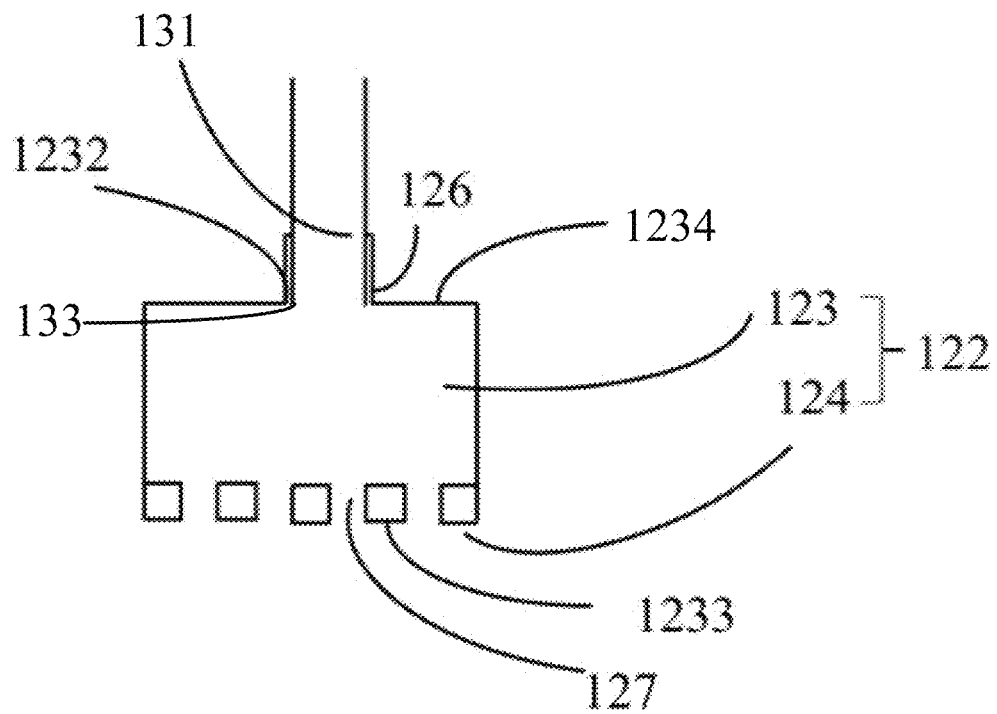
FIG. 2 is a schematic view of the connection relation between an outlet of a tube and a nozzle of the apparatus in FIG. 1.

Referring to FIGS. 1 and 2, an apparatus 10 for making an organic light emitting diode (OLED) of a first embodiment includes an evaporation device 11, a vapor deposition device 12, a connecting tube 13, and a vacuum pump 15. The evaporation device 11 is connected to the vapor deposition device 12 by the connecting tube 13. The vacuum pump 15 is connected to the vapor deposition device 12.

The evaporation device 11 is used to provide a gas to the vapor deposition device 12. The evaporation device 11 includes an evaporation chamber 111 and a first heating device 114. A source material 116 is located in the evaporation chamber 111. The first heating device 114 is used to heat the source material 116 in the evaporation chamber 111 to form the gas. The first heating device 114 and the evaporation device 11 can be spaced from each other or in direct contact with each other. The first heating device 114 can be an induction cooker, a heating sleeve or the like. The evaporation chamber 111 can be located on the induction cooker or placed in the heating sleeve. When an electrical signal is input to the induction cooker or the heating sleeve, the induction cooker or the heating sleeve can heat the evaporation chamber 111. The source material 116 can be organic light emitting source material, the hole transport source material, the hole injection source material, the electron injection source material, or the electron transport source material. Thus, the gas can be gaseous organic light emitting source material, gaseous hole transport source material, gaseous hole injection source material, gaseous electron injection source material, or gaseous electron transport source material. In one embodiment, the organic light emitting source material is located in the evaporation chamber 111, and the gas is gaseous organic light emitting source material.

The vapor deposition device 12 includes a vapor deposition chamber 121, a spray head 122, and a support 129. The spray head 122 and the support 129 are opposite to each other and located in the vapor deposition chamber 121. The vapor deposition chamber 121 is connected to the evaporation chamber 111 by the connecting tube 13. The connecting tube 13 introduces the gas inside of the evaporation chamber 111 to the vapor deposition chamber 121. The connecting tube 13 has an inlet 130 and an outlet 131 opposite to the inlet 130. The inlet 130 extends into the evaporation chamber 111, and a valve 16 can be fixed on the inlet 130 for controlling the gas to enter the connecting tube 13. The outlet 131 is connected to the spray head 122.

The spray head 122 includes a spray body 123 and a nozzle 124. The spray body 123 is a hollow structure. The spray body 123 has a first end 1231 and a second end 1233 opposite to the first end 1231. The connecting tube 13 is connected to the first end 1231, the nozzle 124 is located on the second end 1233, so that the gas in the connecting tube 13 is sprayed by the nozzle 124. The first end 1231 has a body end surface 1234. An opening 1232 is defined on the body end surface 1234. A connecting sleeve 126 can be connected to the body end surface 1234. The connecting sleeve 126 can be a hollow tube-shaped structure. The connecting sleeve 126 is fixed on the body end surface 1234 by sticking or mechanically fastening. The outlet 131 can be inserted into the connecting sleeve 126, or the connecting sleeve 126 can be inserted into the outlet 131. The connecting sleeve 126 can be detachably connected to the outlet 131. The outlet 131 has an end surface 133. The end surface 133 can includes a large through hole or a plurality of small through hole space from each other. The outlet 131 can extend into the spray body 123, so that the end surface 133 is in the spray body 123. Alternatively, the end surface 133 and the body end surface 1234 can be in the same planar surface. In one embodiment, the end surface 133 and the body end surface 1234 are in the same planar surface.

Figure 3:
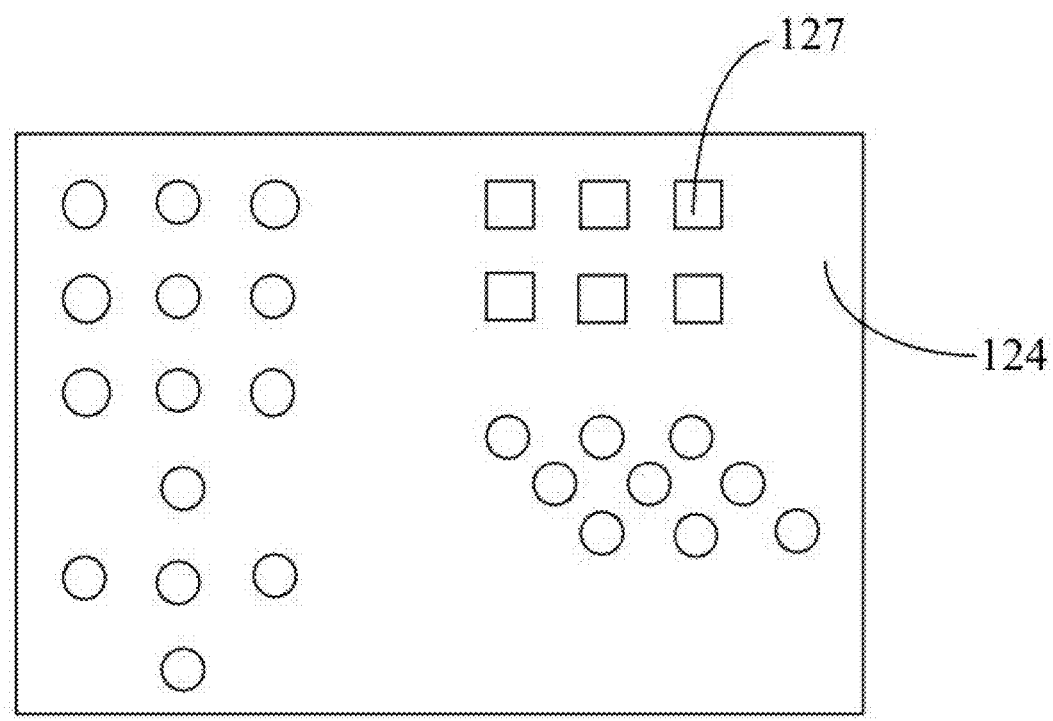
FIG. 3 is a schematic view of the nozzle of the apparatus in FIG. 1.

The nozzle 124 has a plurality of holes 127, and the gas in the connecting tube 13 is sprayed by the plurality of holes 127. The plurality of holes 127 can have the same shape or different shapes, and the plurality of holes 127 can be arranged to form a single pattern or a plurality of patterns, as shown in FIG. 3. When the gaseous organic light emitting source material passes through the plurality of holes 127 to be sprayed on an object, patterned organic light emitting layer can be formed on the object. The nozzle 124 can be detachably connected to the spray body 123. The nozzle 124 and the spray body 123 can be integrated. In one embodiment, the nozzle 124 is detachably connected to the spray body 123.

The support 129 is used for supporting the object, and the organic light emitting layer is deposited on the object. The support 129 is opposite to the plurality of holes 127. The support 129 can be moved in the vapor deposition chamber 121. For example, the vapor deposition device 12 further includes a control unit (not shown in figures) for controlling the movement of the support 129. Accordingly, the object can be moved with the movement of the support 129.

The vacuum pump 15 is used for making the vacuum be in the apparatus 10. On one hand, there is no oxygen in the vapor deposition device 12, preventing the gaseous organic light emitting source material from being oxidized. On the other hand, the pressure in the vapor deposition chamber 121 is low, thus the gas in the evaporation chamber 111 can spontaneously enter the vapor deposition chamber 121 through the connecting tube 13.

Figure 4:
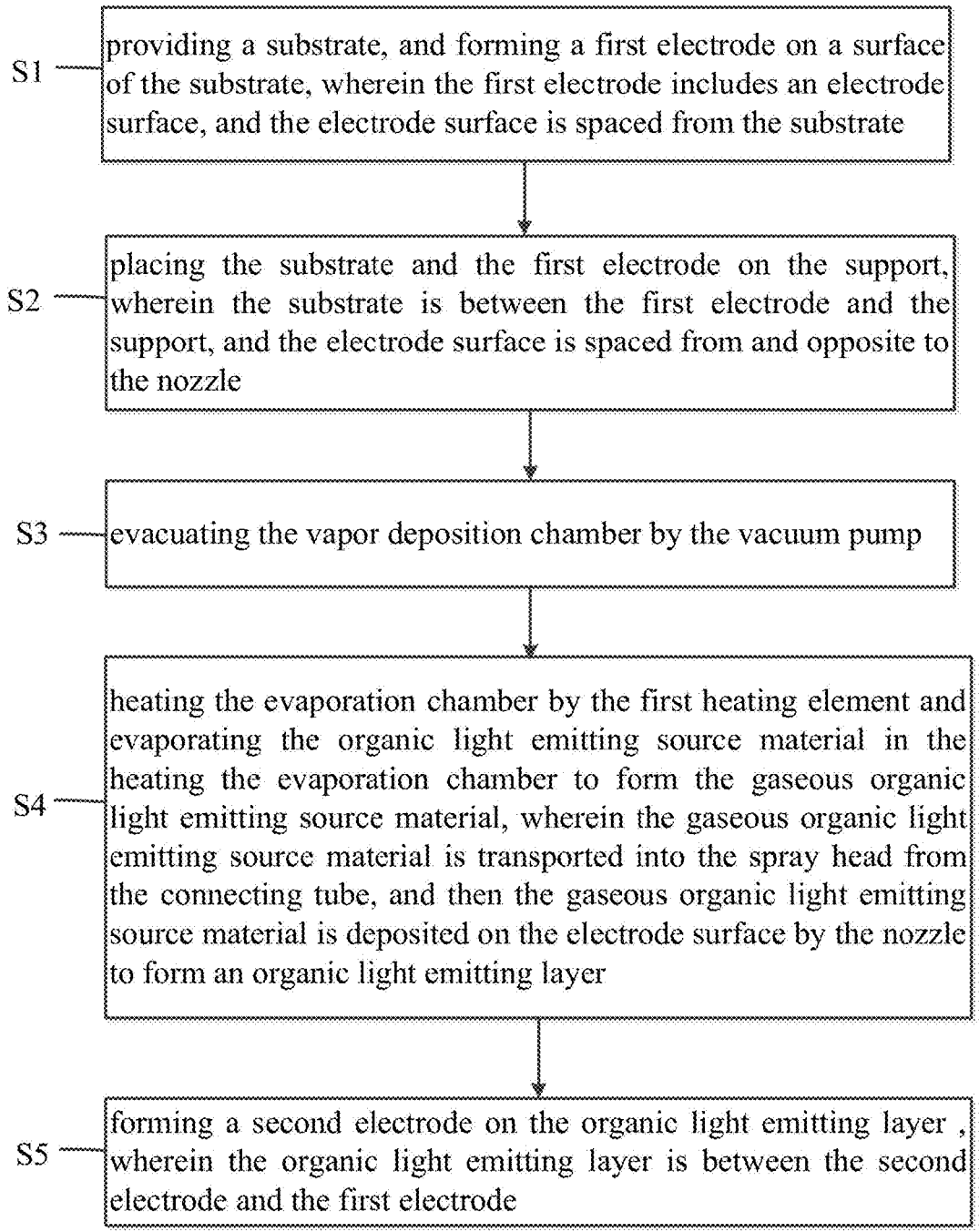
FIG. 4 is a schematic process flow of a method for making an organic light emitting diode by the apparatus of FIG. 1.
Figure 5:
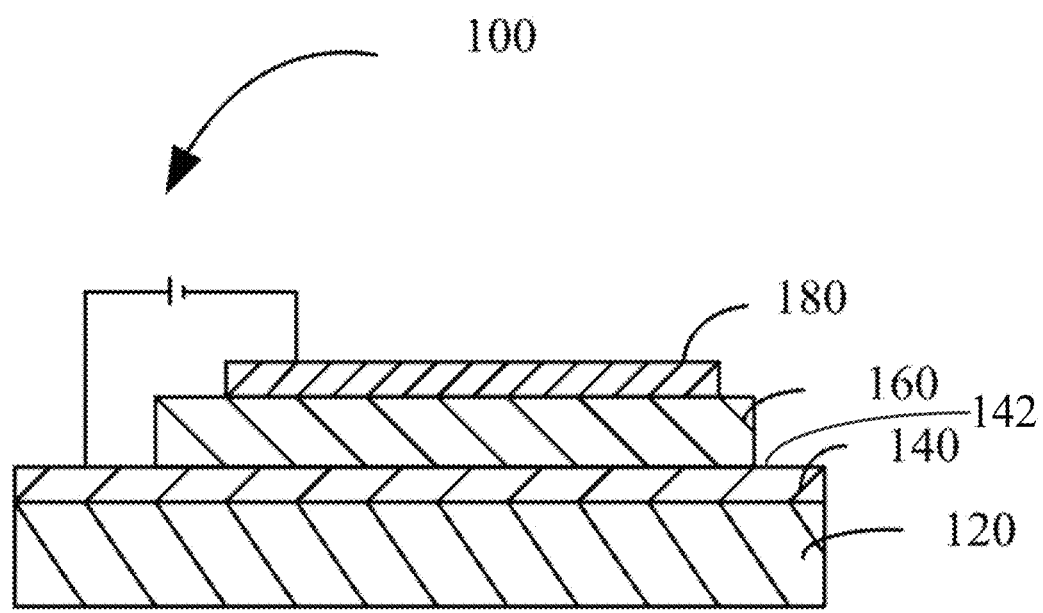
FIG. 5 is a schematic view of an organic light emitting diode that is prepared by the method of FIG. 4.

Referring to FIGS. 4 and 5, a method for making an OLED 100 by the apparatus 10 includes the following steps:

S1, providing a substrate 120, and forming a first electrode 140 on a surface of the substrate 120, wherein the first electrode 140 includes an electrode surface 142, and the electrode surface 142 is spaced from the substrate 120;

S2, placing the substrate 120 and the first electrode 140 on the support 129, wherein the substrate 120 is between the first electrode 140 and the support 129, and the electrode surface 142 is spaced from and opposite to the nozzle 124;

S3, evacuating the vapor deposition chamber 121 by the vacuum pump 15;

S4, heating the evaporation chamber 111 by the first heating device 114 and evaporating the organic light emitting source material in the heating the evaporation chamber 111 to form the gaseous organic light emitting source material, wherein the gaseous organic light emitting source material is transported into the spray head 122 through the connecting tube 13, and then the gaseous organic light emitting source material is deposited on the electrode surface 142 by the nozzle 124 to form an organic light emitting layer 160; and S5, forming a second electrode 180 on the organic light emitting layer 160, wherein the organic light emitting layer 160 is between the second electrode 180 and the first electrode 140.

In the steps S1 and S5, the substrate 120 can be transparent or opaque. The material of the substrate 120 can be glass, quartz, transparent plastic or resin. Each of the first electrode 140 and the second electrode 180 can be a transparent conductive layer or a porous mesh structure, such as ITO layer, FTO layer, or the like. Each of the first electrode 140 and the second electrode 180 can be an opaque conductive layer, such as metal layer. Each of the first electrode 140 and the second electrode 180 can be formed by a conventional method, such as sputtering, coating, vapor deposition or the like. It is understood that when the substrate 120 is opaque, the first electrode 140 can be transparent or opaque, and the second electrode 180 is transparent. It is understood that when the substrate 120 is transparent, the first electrode 140 is transparent, and the second electrode 180 can be transparent or opaque.

In the step S2, in one embodiment, the nozzle 124 and the electrode surface 142 are parallel to each other, and a distance between the nozzle 124 and the electrode surface 142 is in a range from about 1 millimeter to about 10 millimeters.

In the step S3, before evaporating the organic light emitting source material, the vapor deposition chamber 121 is evacuated by the vacuum pump 15, so that there is a vacuum environment in the vapor deposition chamber 121. On one hand, there is no oxygen in the vapor deposition device 12, preventing the gaseous organic light emitting source material from being oxidized. On the other hand, the pressure in the vapor deposition chamber 121 is low, thus the gas can spontaneously enter the vapor deposition chamber 121 through the connecting tube 13.

In the step S4, before heating the organic light emitting source material, the valve 16 on the outlet 131 is closed. The valve 16 on the outlet 131 can be closed after the evaporation chamber 111 became vacuum. When the gaseous organic light emitting source material in the connecting tube 13 reaches a certain amount, the valve 16 on the outlet 131 is opened. After opening the valve 16 on the outlet 131, the gaseous organic light emitting source material is sprayed on the electrode surface 142 at a certain speed. Then the valve 16 on the outlet 131 is closed. After moving the support 129, the valve 16 on the outlet 131 is opened again to spray the gaseous organic light emitting source material at the same speed. When the spraying time of the gaseous organic light emitting source material is constant, the thickness of the organic light emitting layer 160 is uniform.

The organic light emitting source material can be any material that can form the organic light emitting layer 160. The organic light emitting source material can be a precursor, and the precursor reacts during vapor deposing to form the organic light emitting layer 160. The organic light emitting layer 160 is a high molecular polymer or a small molecule organic compound having high quantum efficiency, good semiconductivity, and thermal stability. A molecular weight of the high molecular polymer can be in a range from about 10000 to about 100000. The high molecular polymer can be a conductive conjugated polymer or a semiconductor conjugated polymer. A molecular weight of the small molecule organic compound can be in a range from about 500 to about 20000. The small molecule organic compound can be an organic dye. The organic dye has characteristics of strong chemical modification, wide selection range, easy purification and high quantum efficiency. The small molecule organic compound can be a red material. The red material can be selected from the group consisting of rhodamine dyes, DCM, DCT, DCJT, DCJTB, DCJTI and TPBD. The small molecule organic compound can be a green material. The green material can be selected from coumarin 6, quinacridone (QA), coronene, naphthalimide. The small molecule organic compound can be a blue material. The blue material can be selected from the group consisting of N-arylbenzimidazoles, and 1,2,4-triazole derivatives (TAZ) and distyrylarylene.

The electrical signal is input to the first heating device 114, thus the evaporation chamber 111 is heated, and the organic light emitting source material in the evaporation chamber 111 is evaporated to form gaseous organic light emitting source material. The gaseous organic light emitting source material passes through the connecting tube 13 and is sprayed on the electrode surface 142 by the spray head 122, thus the organic light emitting layer 160 is formed. The gaseous organic light emitting source material is introduced on the first electrode 140 through the connecting tube 13 and the spray head 122. On one hand, the gaseous organic light emitting source material cannot be deposited on the inner wall of the vapor deposition chamber 121, and is not wasted. On the other hand, the thickness of the organic light emitting layer 160 can be uniform by controlling spraying time and speed in different area of the electrode surface 142. FIG. 5 is a schematic view of the organic light emitting diode 100.

Furthermore, in the step S2, before placing the substrate 120 and the first electrode 140 on the support 129, forming a hole injection layer and/or a hole transport layer on the electrode surface 142 of the first electrode 140 can be performed.

Furthermore, after the step S4 and before the step S5, forming an electron transport layer and/or an electron injection layer on the organic light emitting layer 160 can be performed.

The OLED 100 can include the hole injection layer, the hole transport layer, the electron transport layer, or the electron injection layer. The hole injection layer, the hole transport layer, the electron transport layer, and the electron injection layer of OLED 100 can be omitted.

The hole injection layer, the hole transport layer, the electron transport layer, or the electron injection layer can be formed by the apparatus 10 and the method described above. It is understood that the hole injection layer, the hole transport layer, the electron transport layer, or the electron injection layer can be formed by varying the kind of the source material 116 in the evaporation chamber 111 and repeating the step S4. The apparatus 10 can include a plurality of evaporation devices 11 and a plurality of spray heads 122 for forming different functional layers, such as the organic light emitting layer 160, the hole injection layer, the hole transport layer, the electron transport layer, or the electron injection layer.

Figure 6:
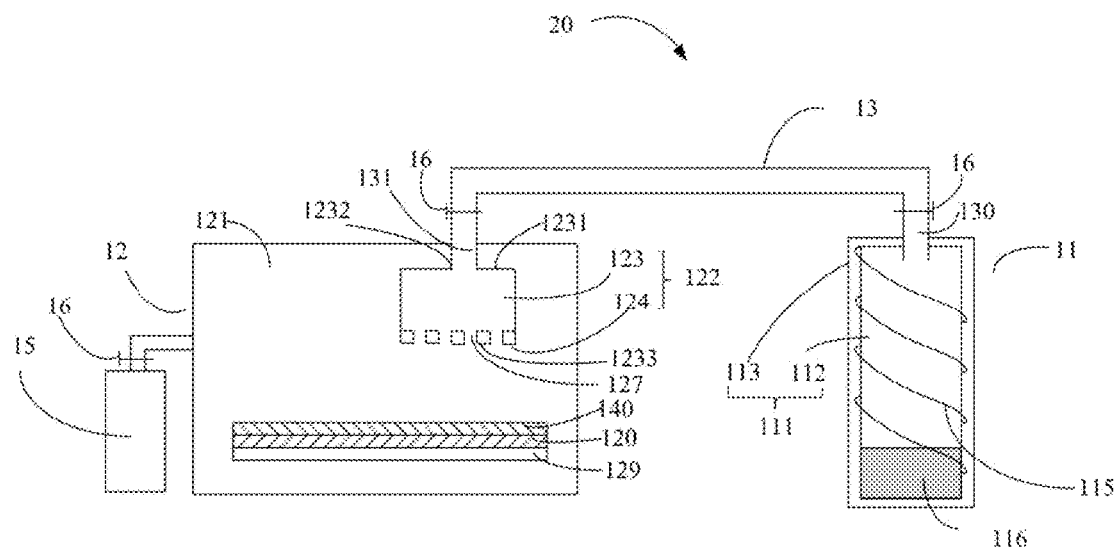
FIG. 6 is a schematic view of a second embodiment of an apparatus for making an organic light emitting diode.

Referring to FIG. 6, an apparatus 20 for making the OLED 100 of a second embodiment is provided. The apparatus 20 in the second embodiment is similar to the apparatus 10 in the first embodiment above except the position relation between the evaporation chamber 111 and the first heating device 114. In the second embodiment, the evaporation chamber 111 includes an inner shell 112 and an outer shell 113 spaced apart from each other. The first heating device 114 includes a heating wire 115. The heating wire 115 is located between the inner shell 112 and the outer shell 113, and the heating wire 115 twines the outer surface of the inner shell 112. The electrical signal is input to the heating wire 115 and the source material 116 is heated. The outer shell 113 is used to keep warm and the material of the outer shell 113 can be heat insulation. The heating mode allows the evaporation chamber 111 and the source material 116 to be heated uniformly, preventing partial gaseous source material 116 from being condensed on the inner wall of the evaporation chamber 111. Thus, the source material 116 would not be wasted because of condensing on the inner wall of the evaporation chamber 111. The temperature of heating the evaporation chamber 111 can be adjusted by changing the input electrical signal. The material of the heating wire 115 can be carbon nanotube, graphene, or metal. The metal can be chrome-nickel alloy, copper, molybdenum, or tungsten.

In second embodiment, the method for making the OLED 100 by the apparatus is similar to the method for making the OLED 100 by the apparatus 10 in the first embodiment above except that the heating modes are different.

Figure 7:
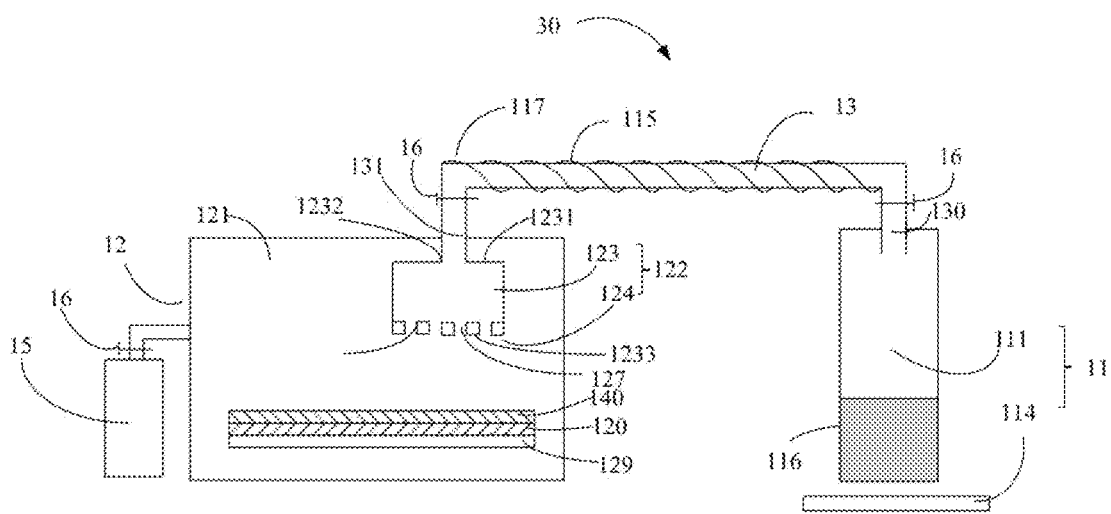
FIG. 7 is a schematic view of a third embodiment of an apparatus for making an organic light emitting diode.

Referring to FIG. 7, an apparatus 30 for making the OLED 100 of a third embodiment is provided. The apparatus 30 in the third embodiment is similar to the apparatus 10 in the first embodiment above except the apparatus 30 further includes a second heating device 117. The second heating device 117 is used for heating the connecting tube 13, to prevent the gas in the connecting tube 13 from being condensed. As the gas spreads along the connecting tube 13, the temperature of the gas becomes low and the pressure of the gas becomes small, the flow speed of the gas in the connecting tube 13 would become slow. The second heating device 117 heats the gas in the connecting tube 13, preventing the flow speed of the gas from slowing. The second heating device 117 can be spaced apart from or in direct contact with the connecting tube 13. In one embodiment, the second heating device 117 includes at least one heating wire 115 spirally wrapped on the outer surface of the connecting tube 13.

In third embodiment, the method for making the OLED 100 by the apparatus 30 is similar to the method for making the OLED 100 by the apparatus 10 in the first embodiment above except that the method for making the OLED 100 by the apparatus 30 includes heating the connecting tube 13 before heating the evaporation chamber 111, to prevent the gas entering the connecting tube 13 from being condensed. It is understood that the connecting tube 13 can be heated after heating the evaporation chamber 111. It is understood that the connecting tube 13 and the evaporation chamber 111 can simultaneously be heated.

Figure 8:
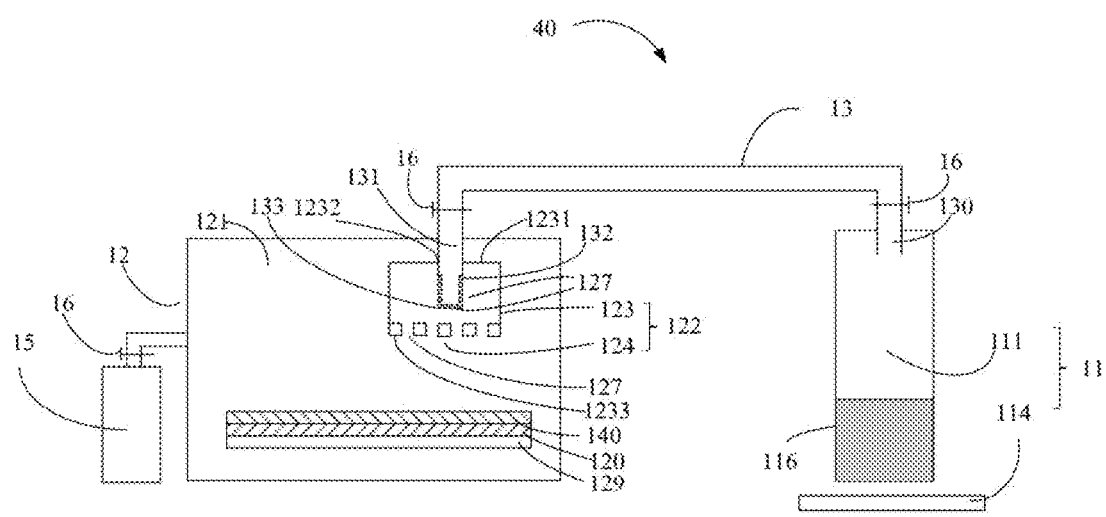
FIG. 8 is a schematic view of a fourth embodiment of an apparatus for making an organic light emitting diode.

Referring to FIG. 8, an apparatus 40 for making the OLED 100 of a fourth embodiment is provided. The apparatus 40 in the fourth embodiment is similar to the apparatus 10 in the first embodiment above except the outlet 131 of the connecting tube 13 extends into inside of the spray body 123, and the side wall 132 of the outlet 131 also includes the plurality of holes 127 spaced from each other.

When there is no hole 127 on the side wall 132 and the gas only come out of the outlet 131 from the end surface 133, the spreading around speed of gas is smaller than the downward speed of the gas. Thus the gas at the middle position of the nozzle 124 is more than the gas at the surrounding position. Accordingly, the flow speed and density of the gas passed through the holes 127 at the middle positon of the nozzle 124 are greater than the flow speed and density of the gas passed through the holes 127 at the rest of positons of the nozzle 124. Thus, the flow speed and density of the gas passed through the nozzle 124 are not uniform.

In the fourth embodiment, both the end surface 133 and the side wall 132 of the outlet 131 include the plurality of holes 127 spaced from each other. The holes 127 of the side wall 132 allows the gas to be quickly dispersed on both sides of the outlet 131, so that the gas can be uniformly distributed in the inside space of the spray bode 123. Thus, the gas can be uniformly distributed on the nozzle 124 and be uniformly sprayed. In one embodiment, the number of holes 127 on the side wall 132 is greater than or equal to the number of the holes 127 on the end surface 133, and the diameter of the holes 127 of the side wall 132 is greater than or equal to the diameter of the holes 127 of the end surface 133. Thus, the gas can be uniformly distributed in the spray body 123.

Figure 9:
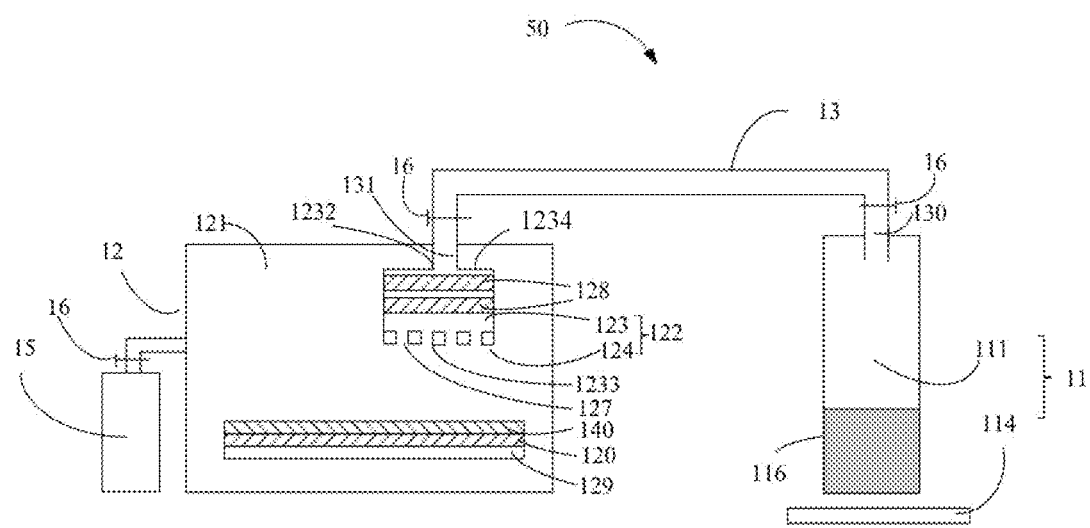
FIG. 9 is a schematic view of a fifth embodiment of an apparatus for making an organic light emitting diode.

Referring to FIG. 9, an apparatus 50 for making the OLED 100 of a fifth embodiment is provided. The apparatus 50 in the fifth embodiment is similar to the apparatus 10 in the first embodiment above except the apparatus 50 further includes a plurality of diffusion plates 128 that is located inside of the spray body 123 and spaced from each other. The plurality of diffusion plates 128 can be parallel to the body end surface 1234. The diffusion plate 128 can be a porous and mesh structure. The diffusion plate 128 is used to reduce the flow speed of the gas from the outlet 131 and make the gas uniformly distribute in the spray body 123. Thus the gas can be uniformly sprayed onto the electrode surface 142 of the first electrode 140.

Figure 10:
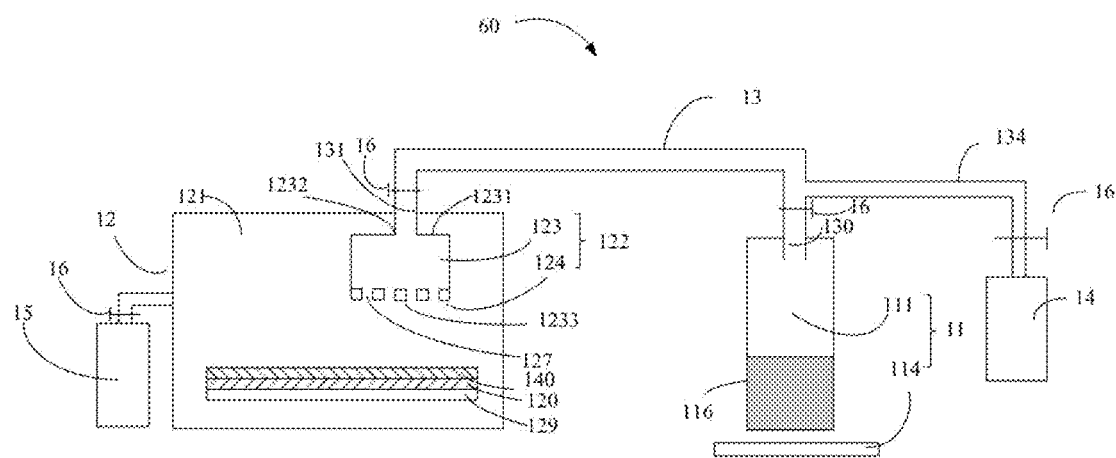
FIG. 10 is a schematic view of a sixth embodiment of an apparatus for making an organic light emitting diode.

Referring to FIG. 10, an apparatus 60 for making the OLED 100 of a sixth embodiment is provided. The apparatus 60 in the sixth embodiment is similar to the apparatus 10 in the first embodiment above except the apparatus 60 further includes a gas supply device 14. The gas supply device 14 is connected to the connecting tube 13 by a tube 134. One end of the tube 134 is connected to the gas supply device 14, and the other end of the tube 134 is connected to the connecting tube 13. The gas supply device 14 is used for supplying an inert gas or nitrogen to the connecting tube 13. On one hand, the inert gas or the nitrogen is supplied to the connecting tube 13 before the gaseous source material enter the connecting tube 13, preventing the gaseous source material 116 from being oxidized by oxygen of air in the connecting tube 13. On the other hand, the inert gas or the nitrogen supplied by the gas supply device 14 has a flow speed and can carry the gaseous source material 116 into the vapor deposition device 12. The flow speed of the gaseous source material 116 can be adjusted by controlling the flow speed of the inert gas or the nitrogen. The gas supply device 14 further includes the valve 16 for controlling the inert gas or the nitrogen.

In sixth embodiment, the method for making the OLED 100 by the apparatus 60 is similar to the method for making the OLED 100 by the apparatus 10 in the first embodiment above except that the method for making the OLED 100 by the apparatus 60 includes supplying the inert gas or the nitrogen by the gas supply device 14 after the step S3 and before the step S4.

Figure 11:
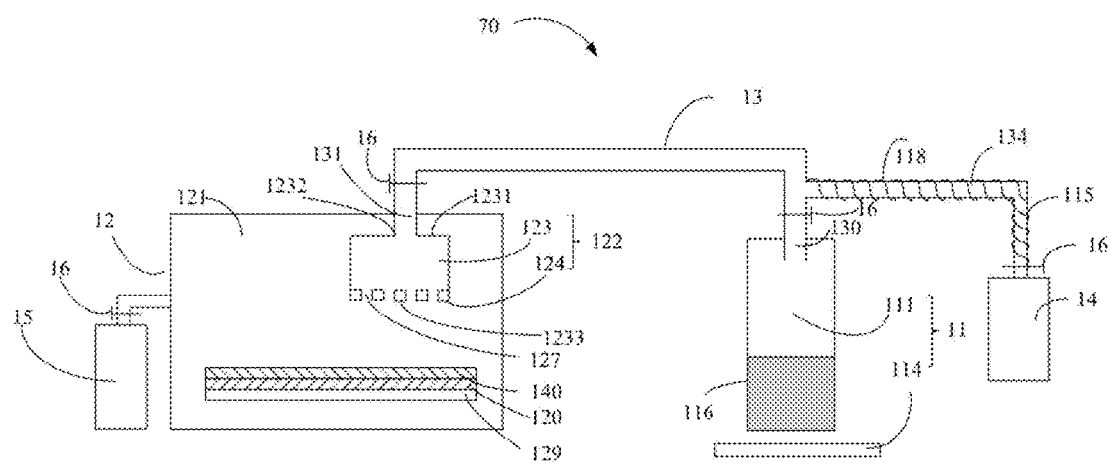
FIG. 11 is a schematic view of a seventh embodiment of an apparatus for making an organic light emitting diode.

Referring to FIG. 11, an apparatus 70 for making the OLED 100 of a seventh embodiment is provided. The apparatus 70 in the seventh embodiment is similar to the apparatus 60 in the sixth embodiment above except the apparatus 70 further includes a third heating device 118 for heating the tube 134. The third heating device 118 includes at least one heating wire 115 that spirally wrapped on the outer surface of the tube 134. The electrical signal is input to the heating wire 115 and the inert gas or the nitrogen of the tube 134 is heated. When the gas in the connecting tube 13 encounters the inert gas or the nitrogen with low temperature, the gas in the connecting tube 13 would be condensed. Thus, heated inert gas or heated nitrogen enters the connecting tube 13, preventing the gas in the connecting tube 13 from being condensed.

In seventh embodiment, the method for making the OLED 100 by the apparatus 70 is similar to the method for making the OLED 100 by the apparatus 60 in the sixth embodiment above except that the method for making the OLED 100 by the apparatus 70 includes heating the tube 134 before supplying the inert gas or the nitrogen by the gas supply device 14.

Figure 12:
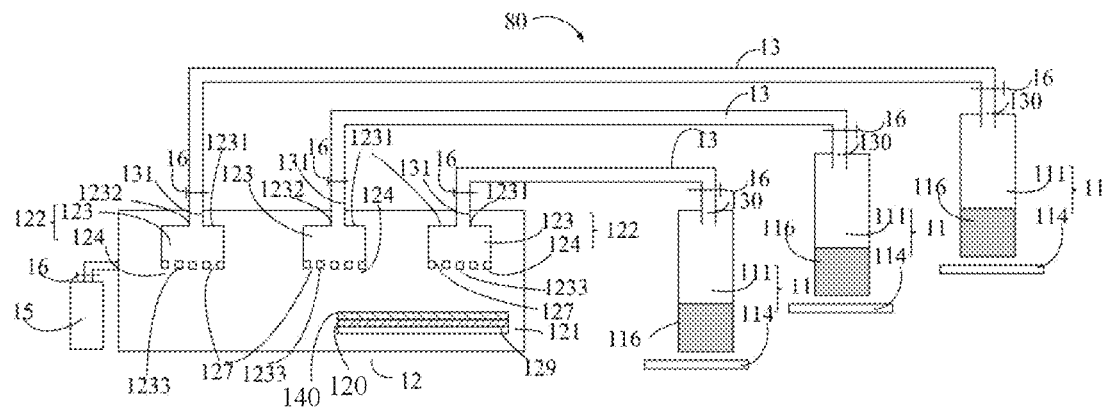
FIG. 12 is a schematic view of an eighth embodiment of an apparatus for making an organic light emitting diode.

Referring to FIG. 12, an apparatus 80 for making the OLED 100 of an eighth embodiment is provided. The apparatus 80 in the eighth embodiment is similar to the apparatus 10 in the first embodiment above except that the apparatus 80 includes a plurality of evaporation devices 11, a plurality of connecting tubes 13, and a plurality of spray heads 122 that are one-to-one correspondence. When different source materials 116 are located in the plurality of evaporation chambers 111, different functional layers can be formed. The plurality of spray heads 122 are spaced from each other, preventing gas from the nozzle 124 from being mixed and being contaminated.

In eighth embodiment, the method for making the OLED 100 by the apparatus 80 is similar to the method for making the OLED 100 by the apparatus 10 in the first embodiment above except that the method for making the OLED 100 by the apparatus 80 includes evaporating different organic light emitting source materials, to form different organic light emitting layers 160 with different colors. The method for making the OLED 100 by the apparatus 80 includes evaporating different source materials, to form different functional layers.

In one embodiment, a hole transport source material is located in the leftmost evaporation chamber 111, an electron transport source material is located in the rightmost evaporation chamber 111, an organic light emitting source material is located in the middle evaporation chamber 111 between the leftmost evaporation chamber 111 and the rightmost evaporation chamber 111; a hole transport layer, an organic light emitting layer, and an electron transport layer can successively be formed on the first electrode 140 by moving the support 129 and controlling the leftmost spray head 122, the middle spray head 122, and the rightmost spray head 122.

In one embodiment, the apparatus 80 includes five evaporation devices 11, five connecting tubes 13, and five spray heads 122 that are one-to-one correspondence. The five evaporation devices 11 are defined as a first evaporation device 11, a second evaporation device 11, a third evaporation device 11, a fourth evaporation device 11, and a fifth evaporation device 11. The five connecting tubes 13 are defined as a first connecting tube 13, a second connecting tube 13, a third connecting tube 13, a fourth connecting tube 13, and a fifth connecting tube 13. The five spray heads 122 are defined as a first spray head 122, a second spray head 122, a third spray head 122, a fourth spray head 122, and a fifth spray head 122. The first electrode source material is located in the first evaporation device 11, the hole transport source material is located in the second evaporation device 11, the organic light emitting source material is located in the third evaporation device 11, the electron transport source material is located in the fourth evaporation device 11, and the second electrode source material is located in the fifth evaporation device 11.

The substrate 120 is located on the support 129. The support 129 is moved to be below the first spray head 122, the first electrode source material is heated to form a gaseous first electrode source material that is introduced to the first spray head 122 by the first connecting tube 13, and the gaseous first electrode source material is sprayed from the first spray head 122 to form the first electrode 140 on the substrate 120. The support 129 is moved to be below the second spray head 122, the hole transport source material is heated to form a gaseous hole transport source material that is introduced to the second spray head 122 by the second connecting tube 13, and the gaseous hole transport source material is sprayed from the second spray head 122 to form the hole transport layer on the surface of the first electrode 140 away from the substrate 120. The support 129 is moved to be below the third spray head 122, the organic light emitting source material is heated to form a gaseous organic light emitting source material that is introduced to the third spray head 122 by the third connecting tube 13, and the gaseous organic light emitting source material is sprayed from the third spray head 122 to form the organic light emitting layer 160 on the surface of the hole transport layer away from the first electrode 140. The support 129 is moved to be below the fourth spray head 122, the electron transport source material is heated to form a gaseous electron transport source material that is introduced to the fourth spray head 122 by the fourth connecting tube 13, and the gaseous electron transport source material is sprayed from the fourth spray head 122 to form the electron transport layer on the surface of the organic light emitting layer 160 away from the hole transport layer. The support 129 is moved to be below the fifth spray head 122, the second electrode source material is heated to form a gaseous second electrode source material that is introduced to the fifth spray head 122 by the fifth connecting tube 13, and the gaseous second electrode source material is sprayed from the fifth spray head 122 to form the second electrode 180 on the surface of the electron transport layer away from the organic light emitting layer 160.

The embodiments shown and described above are only examples. Even though numerous characteristics and advantages of the present technology have been set forth in the foregoing description, together with details of the structure and function of the present disclosure, the disclosure is illustrative only, and changes may be made in the detail, including in matters of shape, size and arrangement of the parts within the principles of the present disclosure up to, and including, the full extent established by the broad general meaning of the terms used in the claims.

Additionally, it is also to be understood that the above description and the claims drawn to a method may comprise some indication in reference to certain steps. However, the indication used is only to be viewed for identification purposes and not as a suggestion as to an order for the steps.

What is claimed is:

1. A method for making an organic light emitting diode, the method comprising:

providing an apparatus comprising an evaporation device, a vapor deposition device, a connecting tube, and a vacuum pump; wherein the evaporation device is connected to the vapor deposition device by the connecting tube, and the vacuum pump is connected to the vapor deposition device; the evaporation device comprises an evaporation chamber and a first heating device, and the first heating device is used to heat an organic light emitting source material in the evaporation chamber; the vapor deposition device comprises a vapor deposition chamber, a spray head, and a support; and the spray head and the support are opposite to each other and located in the vapor deposition chamber;

placing a substrate on the support and forming a first electrode on a surface of the substrate away from the support, wherein the first electrode is spaced apart from and opposite to the spray head, and the first electrode comprises an electrode surface away from the substrate;

evacuating the vapor deposition chamber by the vacuum pump;

heating the organic light emitting source material in the evaporation chamber by the first heating device, to form a gaseous organic light emitting source material;

introducing the gaseous organic light emitting source material to the spray head by the connecting tube;

spraying the gaseous organic light emitting source material to the electrode surface, to form an organic light emitting layer; and forming a second electrode on a surface of the organic light emitting layer away from the first electrode.

2. The method of claim 1, wherein the introducing the gaseous organic light emitting source material to the spray head by the connecting tube comprises heating the connecting tube by a second heating device.

3. The method of claim 1, wherein the introducing the gaseous organic light emitting source material to the spray head by the connecting tube comprises supplying an inert gas or nitrogen gas to the connecting tub by a gas supply device.

4. The method of claim 3, wherein the introducing the gaseous organic light emitting source material to the spray head by the connecting tube further comprises heating the inert gas or nitrogen.

5. The method of claim 1, wherein the spraying the gaseous organic light emitting source material to the electrode surface comprises moving the substrate by moving the support.

6. The method of claim 1, further comprising forming an electron transport layer on the surface of the organic light emitting layer away from the first electrode before forming the second electrode.

7. The method of claim 1, further comprising forming a hole transport layer on the electrode surface before forming the organic light emitting layer.

8. A method for making an organic light emitting diode, the method comprising:

providing an apparatus comprising an evaporation device, a vapor deposition device, a connecting tube, and a vacuum pump; wherein the evaporation device is connected to the vapor deposition device by the connecting tube, and the vacuum pump is connected to the vapor deposition device; the evaporation device comprises an evaporation chamber and a first heating device, and the first heating device is used to heat a source material in the evaporation chamber; the vapor deposition device comprises a vapor deposition chamber, a spray head, and a support; and the spray head and the support are opposite to each other and located in the vapor deposition chamber;

placing a substrate on the support, wherein the substrate is spaced apart from and opposite to the spray head;

evacuating the vapor deposition chamber by the vacuum pump;

heating the source material in the evaporation chamber by the first heating device, to form a gaseous source material;

introducing the gaseous source material to the spray head by the connecting tube; and spraying the gaseous source material to the substrate, to form a functional layer on the substrate, wherein the functional layer is one of a first electrode, a second electrode, an organic light emitting layer, a hole transport layer, a hole injection layer, an electron injection layer, and an electron transport layer.

9. The method of claim 8, wherein the introducing the gaseous source material to the spray head by the connecting tube comprises heating the connecting tube by a second heating device.

10. The method of claim 8, wherein the introducing the gaseous source material to the spray head by the connecting tube comprises supplying an inert gas or nitrogen gas to the connecting tub by a gas supply device.

11. The method of claim 10, wherein the introducing the gaseous source material to the spray head by the connecting tube comprises heating the inert gas or nitrogen.

12. The method of claim 8, wherein the spraying the gaseous source material to the substrate comprises moving the substrate by moving the support.

13. A method for making an organic light emitting diode, the method comprising:

providing an apparatus comprising a plurality of evaporation devices, a vapor deposition device, a plurality of connecting tubes, and a vacuum pump; wherein the plurality of evaporation devices is connected to the vapor deposition device by the plurality of connecting tubes, and the vacuum pump is connected to the vapor deposition device; each of the plurality of evaporation devices comprises an evaporation chamber and a first heating device; the vapor deposition device comprises a vapor deposition chamber, a spray head, and a support; and the spray head and the support are opposite to each other and located in the vapor deposition chamber;

placing a substrate on the support, wherein the substrate is spaced apart from and opposite to the spray head;

evacuating the vapor deposition chamber by the vacuum pump;

heating a source materials in each of the plurality of evaporation chambers by the first heating device, to form different gaseous source materials;

introducing the different gaseous source materials respectively to different spray heads by the plurality of connecting tubes; and spraying the different gaseous source materials to the electrode surface, to form different functional layers.

* * * * *